United States Patent
Lee et al.

(10) Patent No.: US 8,921,180 B2
(45) Date of Patent: Dec. 30, 2014

(54) HIGH-INTEGRATION SEMICONDUCTOR MEMORY DEVICE AND METHOD OF MANUFACTURING THE SAME

(71) Applicant: SK hynix Inc., Gyeonggi-do (KR)

(72) Inventors: Jang Uk Lee, Gyeonggi-do (KR); Sung Cheoul Kim, Gyeonggi-do (KR); Kang Sik Choi, Gyeonggi-do (KR); Suk Ki Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/318,077

(22) Filed: Jun. 27, 2014

(65) Prior Publication Data

US 2014/0308786 A1     Oct. 16, 2014

Related U.S. Application Data

(62) Division of application No. 13/598,364, filed on Aug. 29, 2012, now Pat. No. 8,796,781.

(30) Foreign Application Priority Data

Mar. 14, 2012   (KR) ................. 10-2012-0026091

(51) Int. Cl.
*H01L 21/8234*    (2006.01)
*H01L 27/24*       (2006.01)
*H01L 45/00*       (2006.01)

(52) U.S. Cl.
CPC ............ *H01L 27/2436* (2013.01); *H01L 45/16* (2013.01)
USPC ........................................................ 438/238

(58) Field of Classification Search
CPC ....... H01L 45/06; H01L 45/16; H01L 45/144; H01L 45/1233; H01L 27/2436; H01L 27/2463
USPC ........................................... 257/379; 438/238
See application file for complete search history.

(56) References Cited

U.S. PATENT DOCUMENTS

| | | | |
|---|---|---|---|
| 2009/0121268 A1* | 5/2009 | Lee et al. ........................ | 257/296 |
| 2010/0110753 A1* | 5/2010 | Slesazeck et al. ............. | 365/145 |
| 2010/0128509 A1* | 5/2010 | Kim et al. ....................... | 365/63 |

* cited by examiner

*Primary Examiner* — A. Sefer
(74) *Attorney, Agent, or Firm* — IP & T Group LLP

(57) ABSTRACT

A semiconductor memory device includes a semiconductor substrate, an active region including a plurality of unit active regions and disposed over and spaced from the semiconductor substrate, a pair of word lines formed on a top surface and sides of the unit active region, a dummy word line disposed at a contact of the unit active regions and formed on top surfaces and sides of the unit active regions, a source region in the unit active region between the pair of word lines and electrically connected to the semiconductor substrate, drain regions formed in the unit active region between the pair of word lines and the dummy word line, and first storage layers formed on the drain regions and electrically connected to the drain regions.

4 Claims, 17 Drawing Sheets

HIGH-INTEGRATION SEMICONDUCTOR MEMORY DEVICE AND METHOD OF MANUFACTURING THE SAME

CROSS-REFERENCES TO RELATED APPLICATION

This application is a division of U.S. patent application Ser. No. 13/598,364 filed on Aug. 29, 2012, which claims priority under 35 U.S.C. 119(a) to Korean application number 10-2012-0026091, filed on Mar. 14, 2012, in the Korean Patent Office. The disclosure of each of the foregoing application is incorporated by reference in its entirety.

BACKGROUND OF THE INVENTION

1. Technical Field

The exemplary embodiments of the present invention relates to a semiconductor memory device and a method of manufacturing the same, and more particularly, to a phase-change random access memory (PCRAM) device and a method of manufacturing the same.

2. Related Art

A PCRAM device which is one of nonvolatile memory devices includes a phase-change material of which resistance is changed depending on a temperature. The phase-change material typically includes a chalcogenide material including germanium (Ge), antimony (Sb), and tellurium (Te). The phase-change material is changed into an amorphous state or a crystalline state depending on the temperature to define RESET (or logic "1") or SET (or logic "0").

Like a dynamic random access memory (DRAM) device, the PCRAM device may include a plurality of memory cells defined by word lines and bit lines and each of the plurality of memory cells may include a variable resistor formed of a phase-change material and a switching element configured to selectively drive the variable resistor.

In the PCRAM, the word line may be provided as a junction region type in a semiconductor substrate and a bit line may be provided as a wiring type. A diode or a MOS transistor may be used as the switching element.

The PCRAM is being researched to increase its integration degree while reducing its chip size. However, there is a limit in reducing a minimum feature size due to limitation of resolution.

For this reason, a method of manufacturing a three-dimensional (3D) PCRAM, in which a diode is formed in a vertical pillar shape or a switching transistor is formed using a vertical pillar of gate, has been suggested.

However, actually, it is difficult to form the vertical pillar in the 3D PCRAM.

In particular, to improve an off current characteristic of the diode switch element of a vertical pillar, a height of the vertical pillar is to be increased. Thus, an aspect ratio of the vertical pillar is increased to cause difficulty in a process and diode leaning.

Even in a transistor switching element of a vertical pillar, a height of the vertical pillar is to be also increased to ensure an effective channel length. As in the diode switching element, an aspect ratio of the vertical pillar is increased and thus it may increase a process difficulty and cause a leaning phenomenon.

SUMMARY

According to one aspect of an exemplary embodiment, there is a provided a semiconductor memory device. The semiconductor memory device may include: a semiconductor substrate; an active region including a plurality of unit active regions and disposed over and spaced from the semiconductor substrate; a pair of word lines formed on a top surface and sides of the unit active region; a dummy word line disposed at a contact of the unit active regions and formed on top surfaces and sides of the unit active regions; a source region formed in the unit active region between the pair of word lines and electrically connected to the semiconductor substrate; drain regions formed in the unit active region between the pair of word lines and the dummy word line; and first storage layers formed on the drain regions and electrically connected to the drain regions.

According to another aspect of an exemplary embodiment, there is a provided a semiconductor memory device. The semiconductor memory device may include: a semiconductor substrate; a plurality of active regions formed on the semiconductor substrate in a line-shaped pattern structure; a plurality of word lines crossing he plurality of active regions and surrounding the plurality of active regions; source and drain regions formed in the plurality of active regions between the plurality of word lines; and storage layers formed on the source and drain regions. Each of the source regions may be formed in a post structure extending from the active region to the semiconductor substrate.

According to another aspect of an exemplary embodiment, there is a provided a method of manufacturing a semiconductor memory device. The method may include: forming a line pattern-shaped active region including posts at a first constant interval on a semiconductor substrate; forming a plurality of word lines at a second constant interval to cross the active region; performing ion implantation of impurities on the active region at both sides of each of the word lines to form source regions in the implanted active region corresponding to the posts and drain regions in remaining implanted active region; forming lower electrodes on the source and drain regions exposed between the word lines; forming a spacer insulating layer on the lower electrodes and sidewalls of the word lines; etching the spacer insulating layer to selectively expose the lower electrodes on the drain regions; and forming storage layers on the exposed lower electrodes and the spacer insulating layer.

According to another aspect of an exemplary embodiment, there is a provided a method of manufacturing a semiconductor memory device. The method may include: forming a sacrificial layer and a line pattern-shaped active region on a semiconductor substrate; forming a plurality of word lines at a constant interval to cross the active region; selectively removing the sacrificial layer; forming an insulating layer in a space between the word lines and a space from which the sacrificial layer is removed; selectively etching the insulating layer on the active region between the word lines to expose the active region; etching the exposed active region and the insulating layer below the exposed active region to form a source contact hole exposing the semiconductor substrate; forming a source post in the source contact hole to be connected to the active region; ion-implanting impurities in the source pose and the active region at both sides of each of the word lines to form a source region in the source post and drain regions in the active region; forming lower electrodes on the source and drain regions; forming a spacer insulating layer on the lower electrodes; etching the spacer insulating layer to selectively expose the lower electrode on the drain regions; and forming storage layers on the spacer insulating layer and the exposed lower electrodes.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
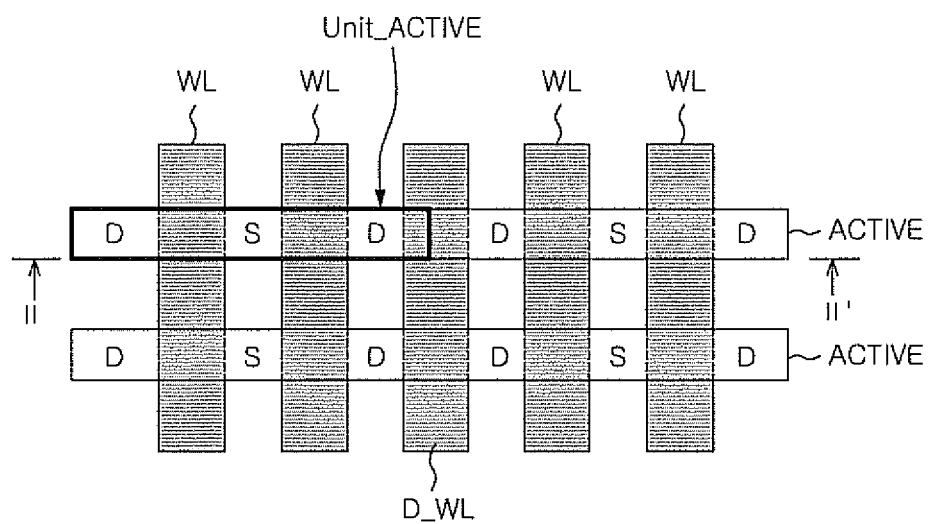
FIG. 1 is a schematic plan view of a high-integration semiconductor memory device according to an exemplary embodiment of the present invention.

Hereinafter, exemplary embodiments will be described in greater detail with reference to the accompanying drawings.

Exemplary embodiments are described herein with reference to illustrations that are schematic illustrations of exemplary embodiments (and intermediate structures). As such, actual sizes and proportions of implemented exemplary embodiments may vary from the illustrated sizes and proportions. Further, exemplary embodiments should not be construed as limited to the particular shapes of regions illustrated herein but construed to include deviations in shapes that result from actual implementation. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
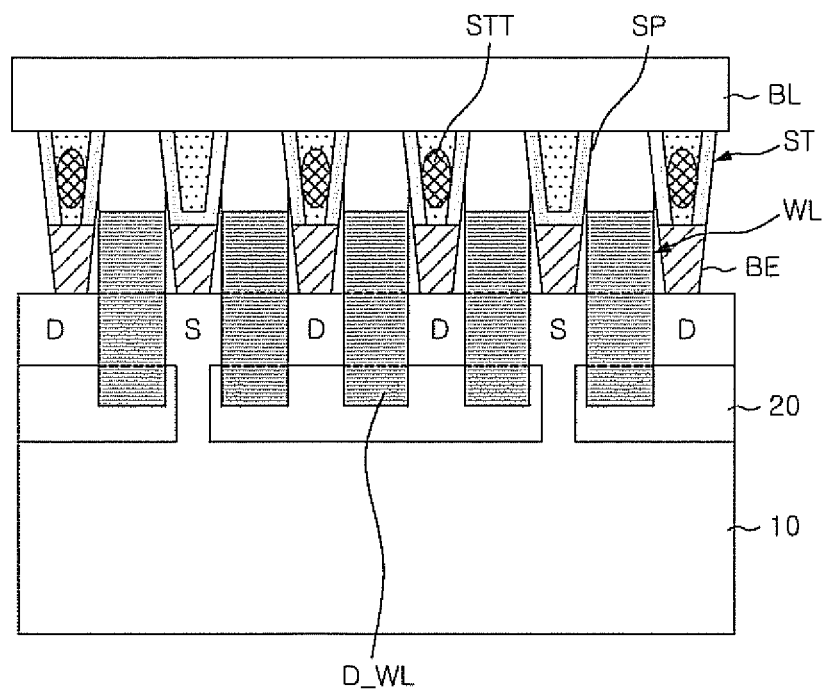
FIG. 2 is a cross-sectional view of the high-integration semiconductor memory device taken along line II-II' of FIG. 1.

FIG. 1 is a plan view of a semiconductor memory device according to an exemplary embodiment of the present invention and FIG. 2 is a cross-sectional view of the semiconductor memory device taken along line II-II' of FIG. 1.

Referring to FIG. 1, a plurality of active regions ACTIVE having a line shape are arranged. Each of the plurality of active regions ACTIVE may includes a plurality of unit active regions unit_ACTIVE. A pair of word lines WL are arranged on each unit active region unit-ACTIVE and extend to be spaced at a constant interval. A dummy word line D_WL is arranged between the pairs of word lines WL.

A source region S is formed in the unit active region unit_ACTIVE between the pair of word lines WL which are arranged on the unit active region unit_ACTIVE. Drain regions D are formed in the unit active region unit_ACTIVE at both sides of the pair of word lines WL. Although the unit active regions unit_ACTIVE are distinguished by the dummy word line D_WL, substantially, the unit active regions unit_ACTIVE are coupled to each other to define the line pattern-shaped active region ACTIVE.

As shown in FIG. 2, the source region S is formed to be coupled to the semiconductor substrate 10, while the drain region D is formed to be insulated from the semiconductor substrate 10 by an insulating layer 20.

Lower electrodes BE are disposed on the source region S and the drain regions D, respectively and storage layers ST 40 are formed on the lower electrodes BE. The storage layers ST may be formed to be buried in a space between the word lines WL and the dummy word line D_WL. The storage layers ST over the drain regions D are electrically connected to the underlying lower electrodes BE, while the storage layer ST over the source region S is insulated from the underlying lower electrode BE by a spacer insulating layer SP. Further, a portion in the storage layer ST indicated by a symbol STT is a portion in which data is stored, for example, a portion in which a phase-change occurs when the semiconductor memory device is a PCRAM device. A bit line BL is formed on the storage layers ST to cross the word line WL, for example, in a shape overlapping the active region ACTIVE.

At this time, for the description purpose, the bit line is omitted from FIG. 1.

In the exemplary embodiment, the active region is formed to have a line-shaped channel layer extending in a horizontal direction and thus the memory device is manufactured in a stable structure. In addition, the word line is formed to surround three sides of the line-shaped semiconductor layer so that a surrounding gate effect is obtained and thus transistor performance is improved. The data storage is performed in spaces at both sides of the word line so that increase in a height of the device is prevented.

The semiconductor memory device having the above-described structure will be described in detail with reference to FIGS. 3A to 3H and FIGS. 4A to 4H.

Figure 3A:
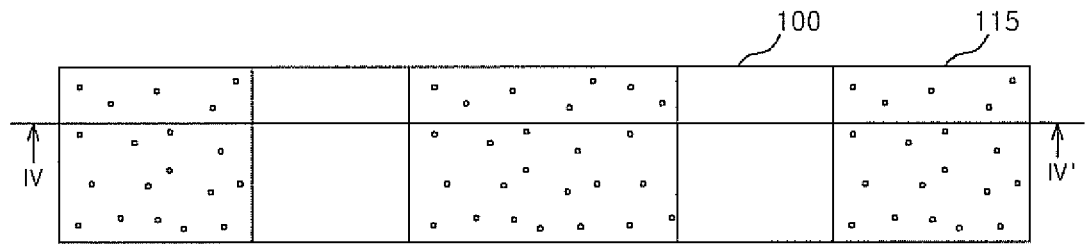
FIGS. 3A to 3H are plan views illustrating a high-integration semiconductor memory device according to an exemplary embodiment of the present invention.
Figure 4A:
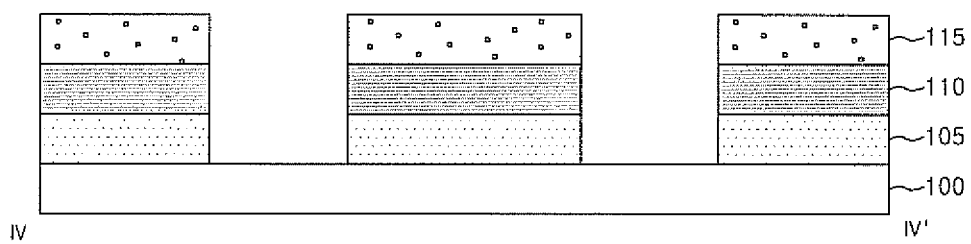
FIGS. 4A to 4H are cross-sectional views of the high-integration semiconductor memory device taken along lines IV-IV' of FIGS. 3A to 3H, respectively.

Referring to FIGS. 3A and 4A, a sacrificial layer 105 and a first semiconductor layer 110 are sequentially formed on a semiconductor substrate 100. The sacrificial layer 105 and the first semiconductor layer 110 may include semiconductor materials having a different etch selectivity from each other. For example, the sacrificial layer 105 may include a silicon germanium (SiGe) layer and the semiconductor layer 110 may include a silicon (Si) layer. The sacrificial layer 105 and the first semiconductor layer 110 may be formed through an epitaxy method so that the sacrificial layer 105 and the semiconductor layer 110 have a perfect crystalline state. To define a switching transistor region, a first photoresist pattern 115 is formed on the first semiconductor layer 110. The first semiconductor layer 110 and the sacrificial layer 105 are patterned in a shape of the first photoresist pattern 115. By the patterning process, a defined portion of the semiconductor substrate 100 is exposed and the exposed portion of the semiconductor substrate 100 may be a source region of the transistor later.

Figure 3B:
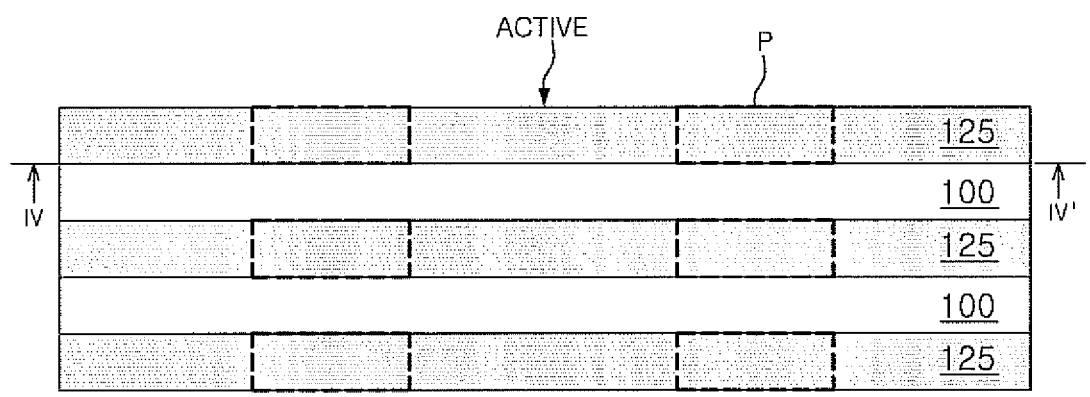
Figure 4B:
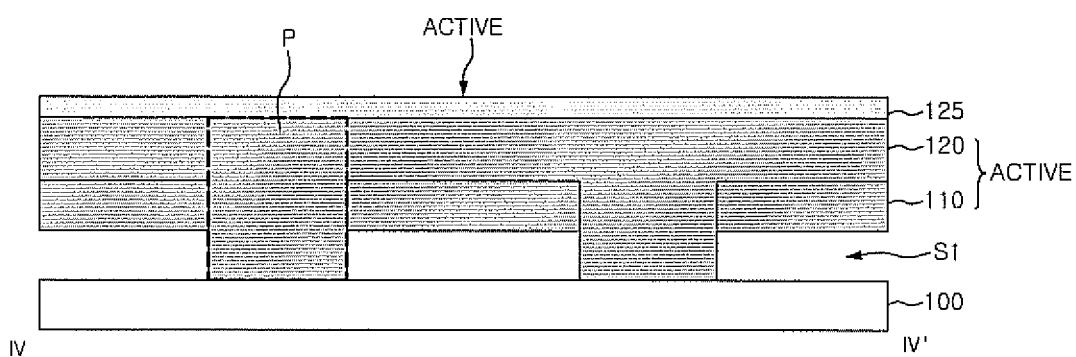

Referring to FIGS. 3B and 4B, the first photoresist pattern 115 is removed through a general process and a second semiconductor layer 120 is formed on the first semiconductor layer 110. The second semiconductor layer 120 may be formed by flowing/growing the first semiconductor layer 110. Alternatively, the second semiconductor layer 120 may be formed to be buried in a space between the first semiconductor layers 110. A chemical mechanical polishing (CMP) process may be further performed to planarize a surface of the semiconductor substrate 120. A hard mask layer 125 is deposited on the second semiconductor layer 120 and the hard mask layer 125 is patterned to define an active region ACTIVE. Next, the second semiconductor layer 120, the first semiconductor layer 110 and the sacrificial layer 105 are patterned in a shape of the hard mask layer 125. The exposed sacrificial layer 105 is removed using a selective etching process to define the active region ACTIVE. A lower space s1 is formed in a portion from which the sacrificial layer 105 is removed and a source post P denotes a portion of the second semiconductor layer 120 which is used as a source region later. Therefore, the lower space s1 is disposed below the first semiconductor layer 110 at both sides of the source post P of FIG. 2.

Figure 3C:
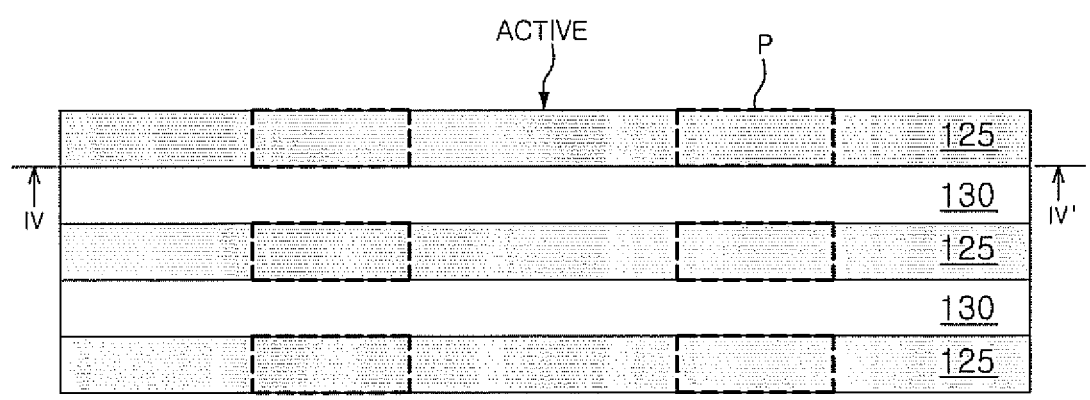
Figure 4C:
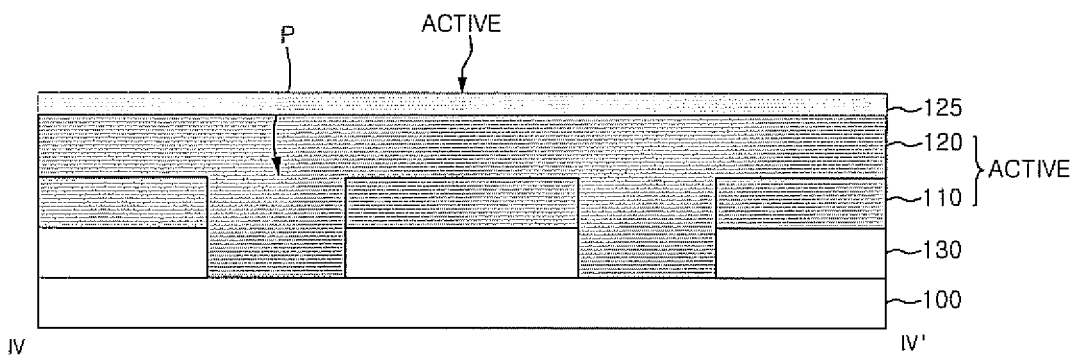

Referring to FIGS. 3C and 4C, a first interlayer insulating layer 130 is formed on a resultant structure of the semiconductor substrate 100. The first interlayer insulating layer 130 may include an insulating layer having a good gap-fill characteristic to be fully filled in the lower space s1. The first interlayer insulating layer 130 may be partially filled in a space between the active regions ACTIVE as well as the lower space s1. Next, the first interlayer insulating layer 130 is recessed by a given thickness so that the first interlayer insulating layer 130 remains on a surface of the semiconductor substrate 100 in the space between the active regions ACTIVE.

Figure 3D:
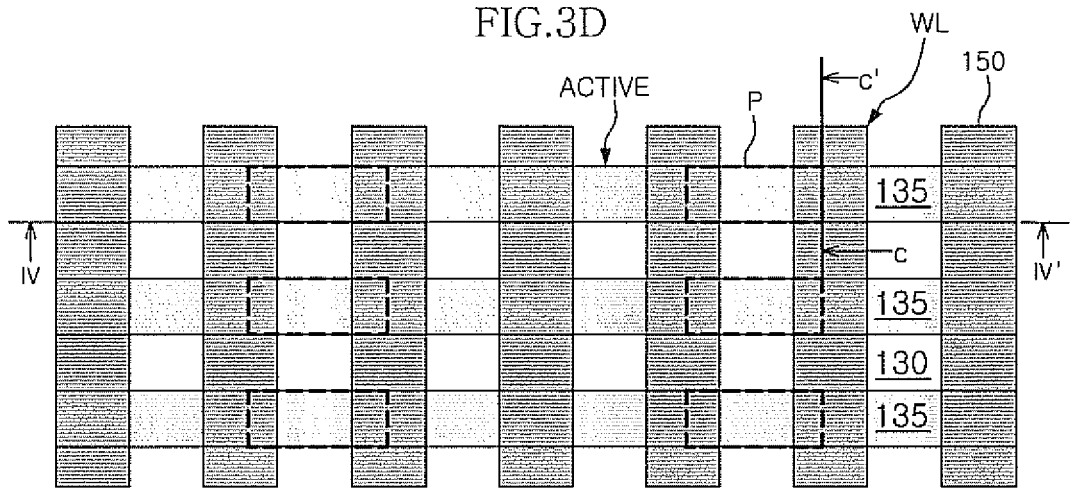
Figure 4D:
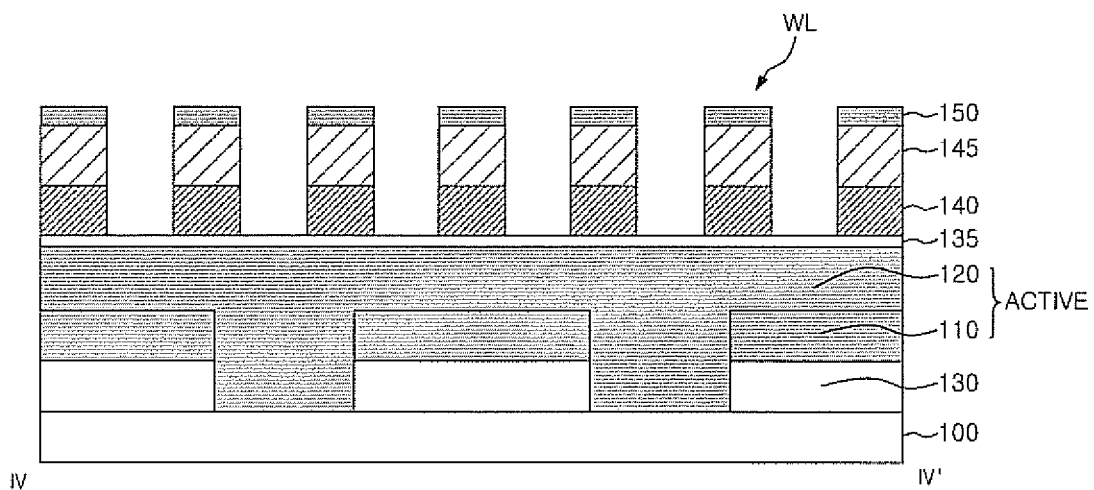

Referring to FIGS. 3D and 4D, the remaining hard mask layer 125 is removed. The exposed surface by the removing the hard mask layer 125 is oxidized into a thin film to form a gate oxide layer 135. Subsequently, a gate conductive layer 140, a gate barrier metal layer 145, and a hard mask layer 150 are sequentially deposited on the gate insulating layer 135. The stacked gate conductive layer 140, the gate barrier metal layer 145, and the hard mask layer 150 are patterned in a line shape to cross the active regions ACTIVE so that a plurality of word lines WL are formed. For example, the gate conductive layer 140 may include a polysilicon layer doped with impurities. The gate barrier metal layer 145 may include a transition metal, for example, a tungsten metal layer and the hard mask layer 150 may include a silicon nitride layer.

Figure 5:
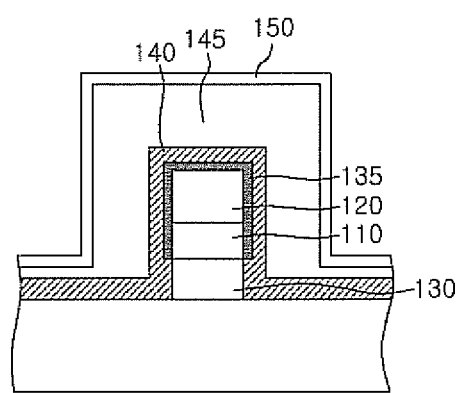
FIG. 5 is a cross-sectional view illustrating a high-integration semiconductor memory device according to another exemplary embodiment of the present invention.

In a cross section taken along C-C' line of FIG. 3D, the word line WL may be formed to surround the active region ACTIVE as shown in FIG. 5. Therefore, the word line WL surrounds three sides of the active region ACTIVE so that an effective channel length is increased to reinforce channel characteristics of a transistor.

Figure 3E:
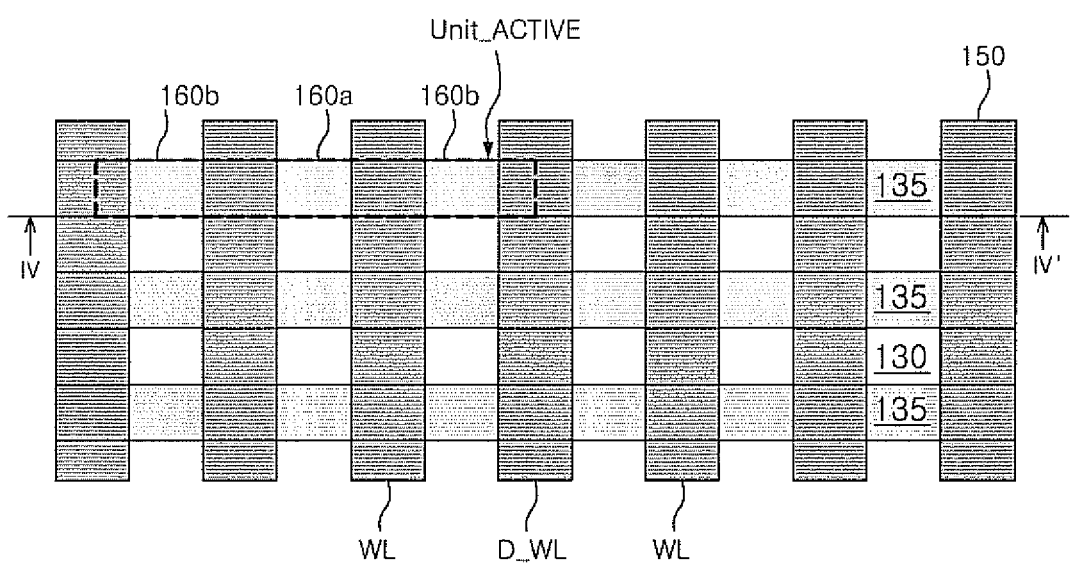
Figure 4E:
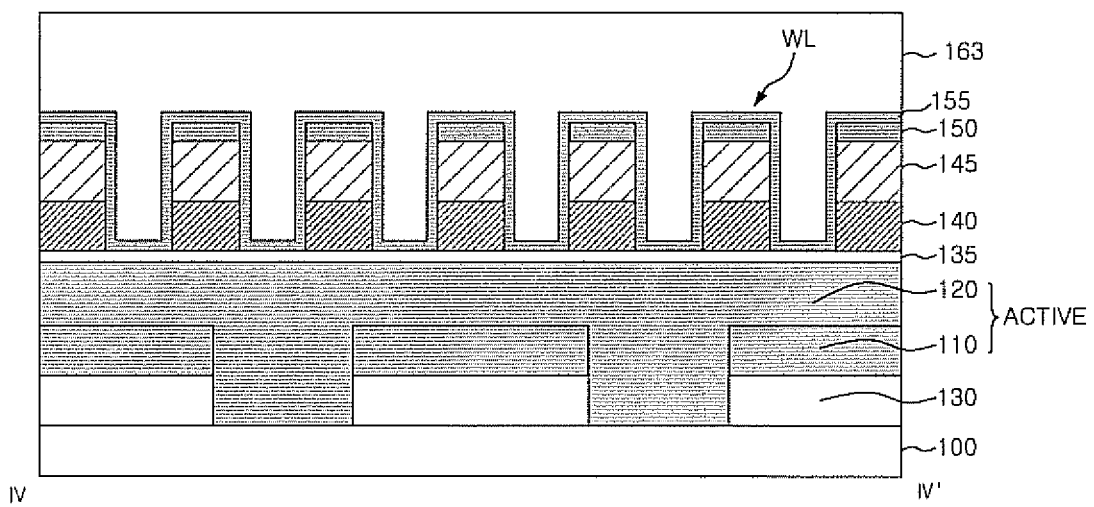

Referring to FIGS. 3E and 4E, a nitride layer 155 for a first spacer is formed on a resultant surface of the semiconductor substrate 100 on which the word lines WL are formed. Next, n-type impurities are ion-implanted into the second and first semiconductor layers 120 and 110 at both sides of the word line WL to form a source region 160a and drain regions 160b. The source region 160a is formed in a source post p including the second semiconductor layer 120 and the drain region 160b is formed in the first and second semiconductor layers 110 and 120 above the lower space s1. In addition, an impurity region may be formed in a surface region of the semiconductor substrate 100 through the source region 160a and the drain regions 160b. A second interlayer insulating layer 163 is formed on a resultant structure of the semiconductor substrate 100. Therefore, drain regions 160b are arranged at both sides of one source region 160a and in the exemplary embodiment, an area configured of the one source region 160a and the drain regions 160b at both sides thereof may be defined as a unit active region unit_ACTIVE.

The word line WL may be disposed between the source region 160a and the drain region 160b and a word line D_WL may be disposed between the drain regions 160b. At this time, the word line D_WL disposed between the drain regions 160b may be a dummy gate D_WL which does not function as an actual gate. The dummy word line D_WL may be supplied with a given voltage so that the dummy word line D_WL does not function as the word line WL. Although not shown, an impurity region may be formed in an area of the semiconductor substrate 100 which overlaps the dummy word line D_WL.

The dummy word line D_WL may be formed to have an arrangement structure in which the word lines area arranged at a uniform interval and to serve to divide the unit active regions unit_ACTIVE. The second interlayer insulating layer 163 is formed to be buried within a space between word lines WL.

Figure 3F:
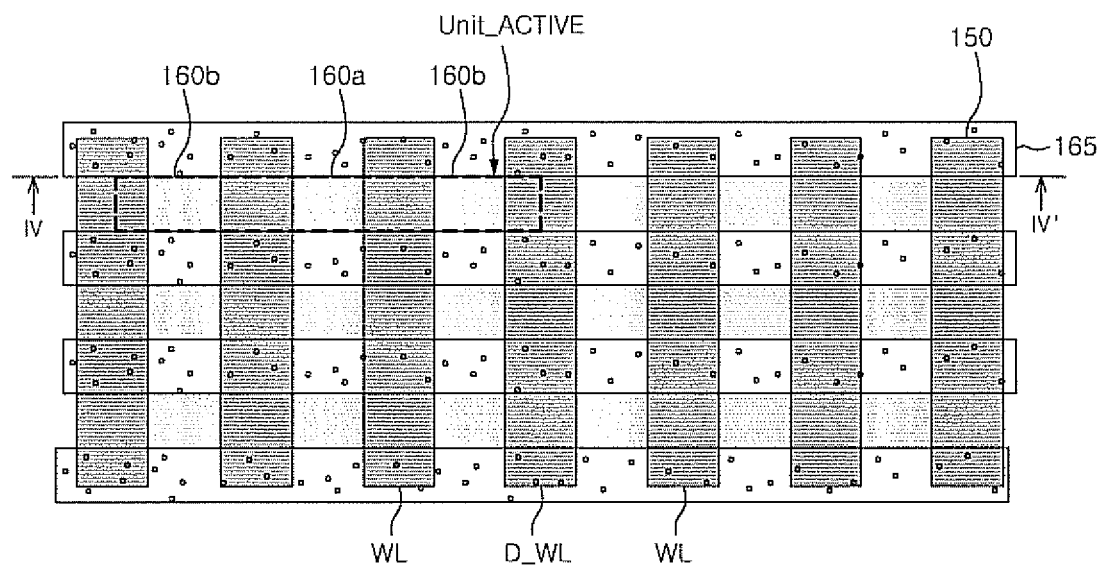
Figure 4F:
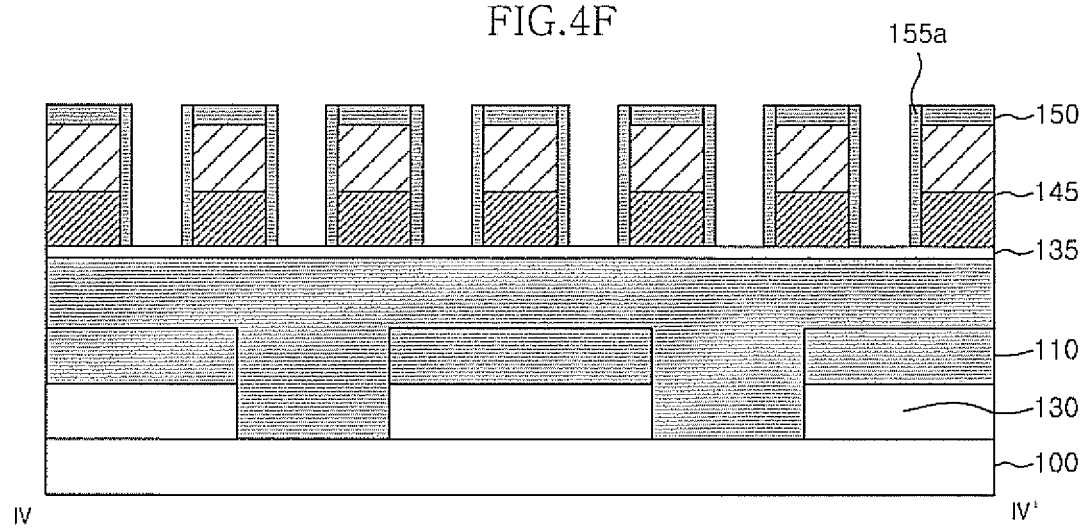

Referring to FIGS. 3F and 4F, a second photoresist pattern 165 is formed on a space between the active regions ACTIVE to expose a portion of the second interlayer insulating layer 163 corresponding to the active regions ACTIVE. The portion of the second interlayer insulating layer 163 exposed by the second photoresist pattern 165 is removed. The nitride layer 155 for a first spacer is anisotropically etched to form a first spacer 155a on sidewalls of the word line WL. The exposed gate insulating layer 135 by the first spacer 155a is removed. Therefore, the source region 160a and the drain regions 160b are exposed.

Figure 3G:
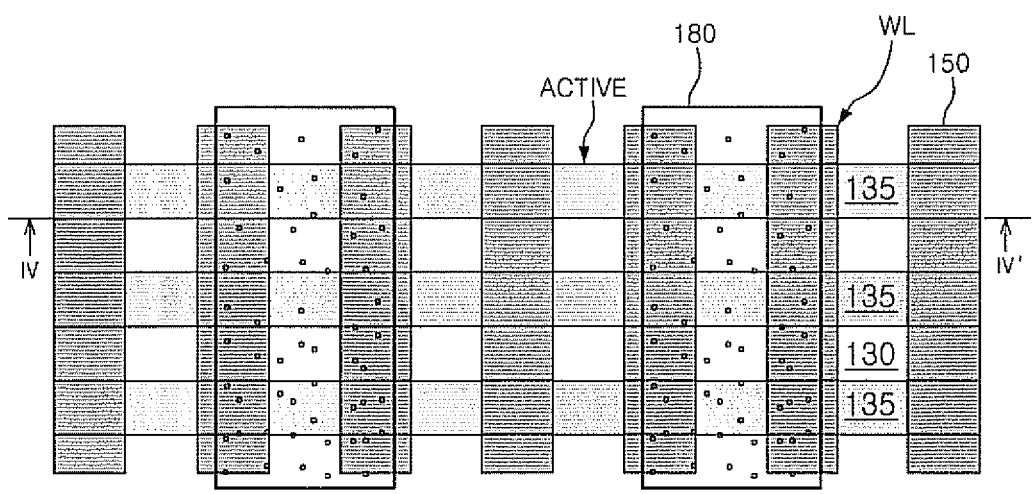
Figure 4G:
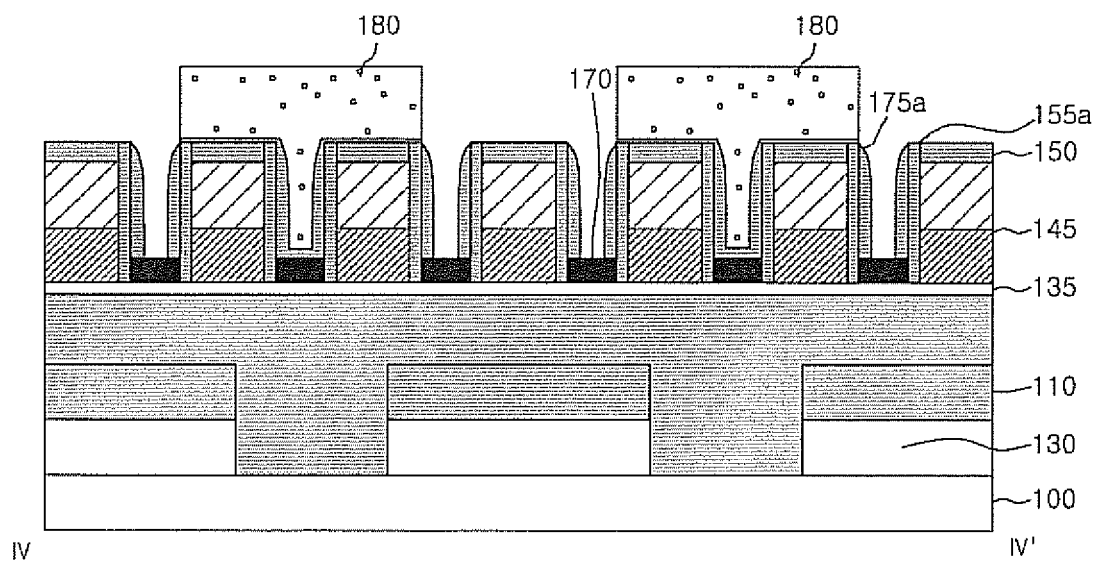

Referring to FIGS. 3G and 4G, lower electrodes 170 are formed on the exposed source region 160a and drain regions 160b. A conductive layer may be deposited on a resultant structure of the semiconductor substrate 100 and then recessed so that the lower electrodes 170 may remain in a bottom of a space between the word lines WL. A second nitride layer 175 for a second spacer is formed on the word lines WL and the lower electrodes 170. At this time, for the description purpose, the nitride layer 175 for a second spacer is omitted from FIG. 3G. A third photoresist pattern 180 is formed on a portion of the nitride layer 175 for a second spacer over the source region 160a to expose a portion of the nitride layer 175 for a second spacer over the drain regions 160b. The portion of the nitride layer 175 for a second spacer exposed by the third photoresist pattern 180 is anisotropically etched to form a second spacer 175a which exposes the lower electrodes on the drain regions 160b. The lower electrode 170 on the source region 160a is shielded by the second spacer 175.

Figure 3H:
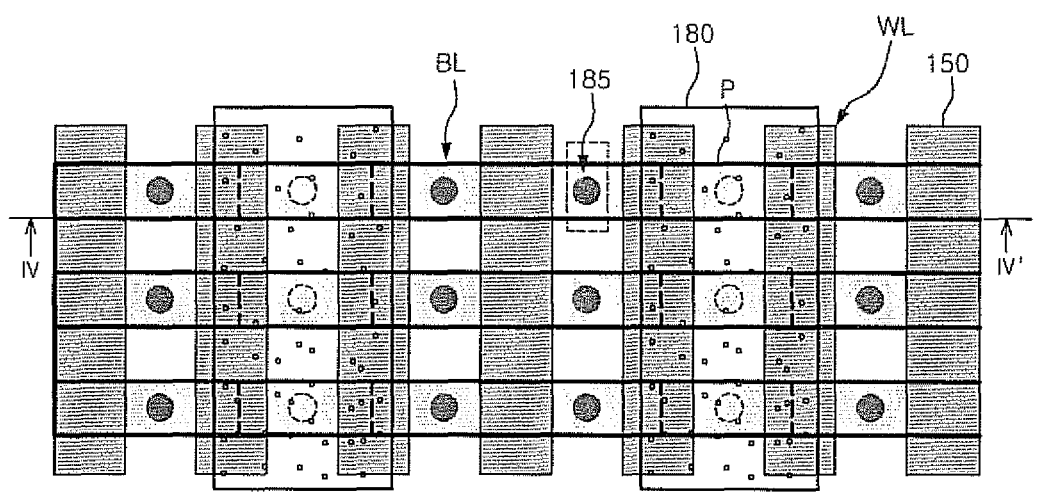
Figure 4H:
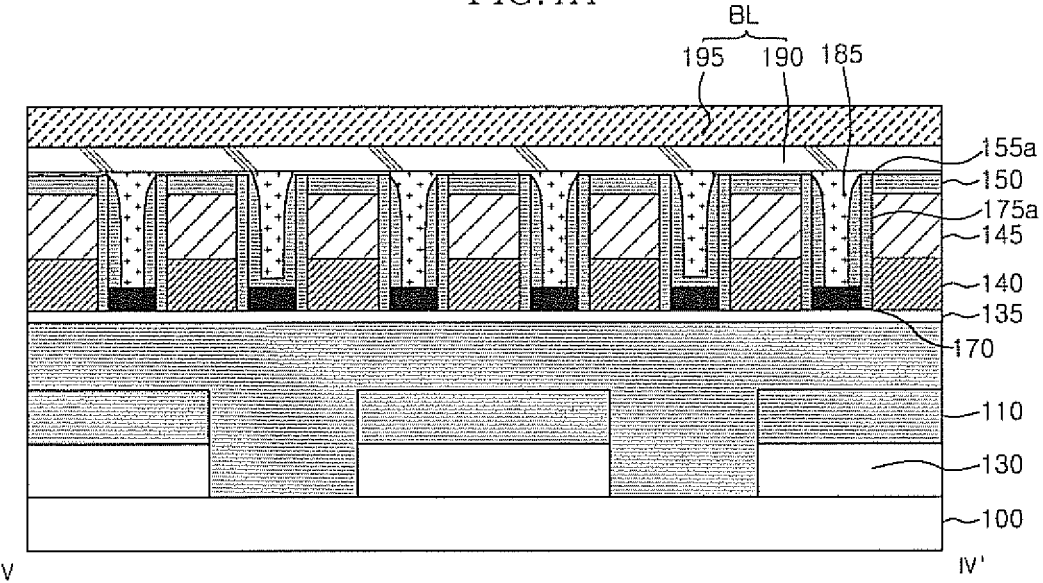

Referring to FIGS. 3H and 4H, the third photoresist pattern 180 is removed by a general process. A phase-change material layer 185 is deposited and then planarized to be buried within a space between the word lines WL. At this time, the phase-change material layer 185 is in contact with the lower electrodes 170 on the drain regions 160b and insulated with the lower electrode 170 on the source region 160a. An upper electrode layer 190 and a conductive layer 195 for a bit line are deposited on the phase-change material layer 185 and etched to remain in the active region ACTIVE, thereby forming a bit line BL.

Figure 6:
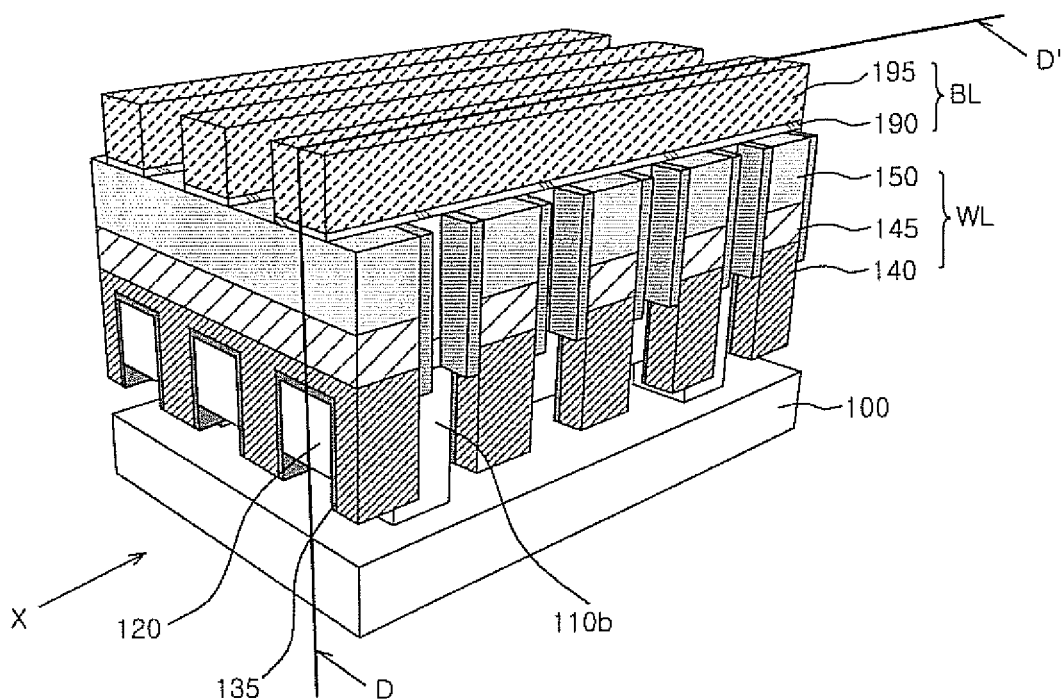
FIG. 6 is a perspective view illustrating a high-integration semiconductor memory device according to an exemplary embodiment of the present invention.
Figure 7:
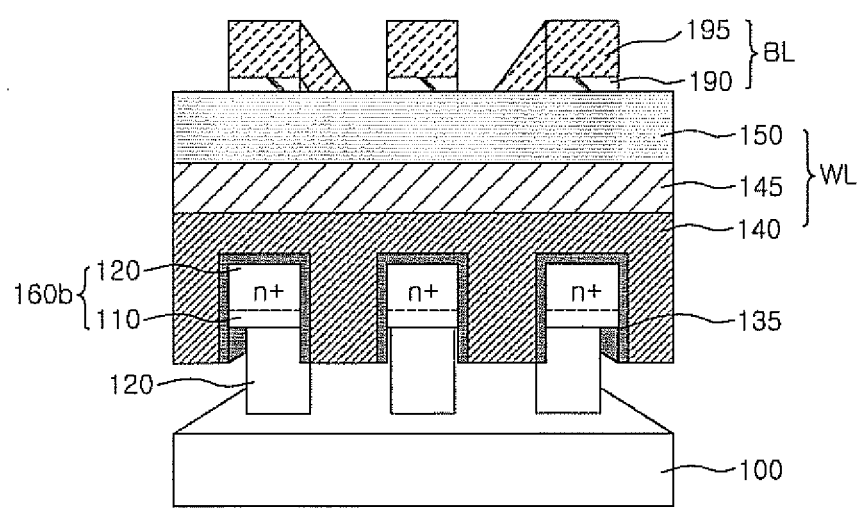
FIG. 7 illustrates the high-integration semiconductor memory device of FIG. 6 in a view of X-direction.
Figure 8:
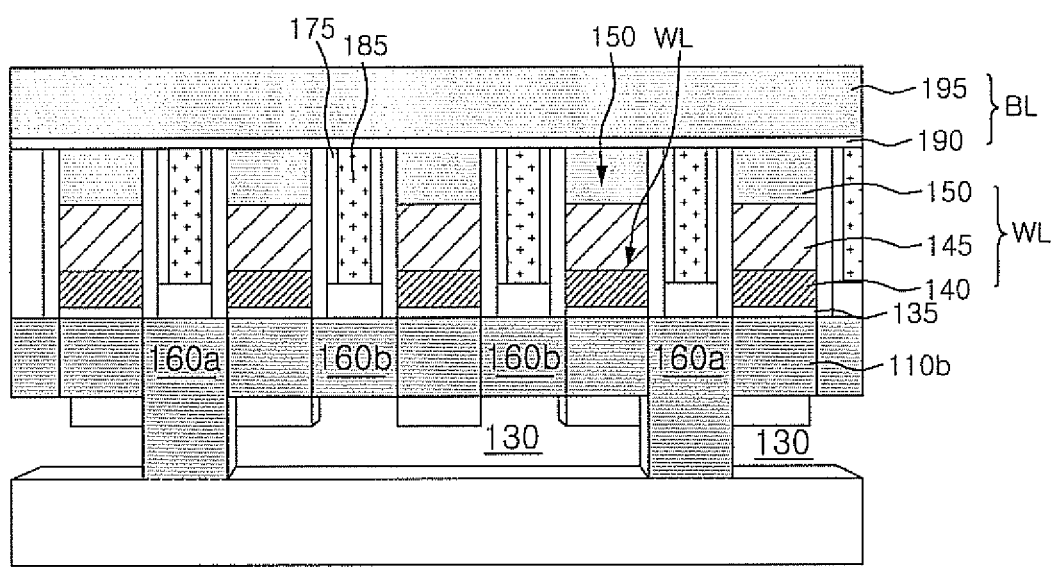
FIG. 8 is a cross-sectional view of the high-integration semiconductor memory device taken along line D-D' of FIG. 6.

FIG. 6 is a perspective view of the semiconductor memory device formed according to the exemplary embodiment, FIG. 7 illustrates the semiconductor memory device in the view of an x-direction of FIG. 6, and FIG. 8 is a cross-sectional view of the semiconductor memory device taken along line D-D' of FIG. 6. Here, FIG. 8 illustrates the case that only the first semiconductor layer 110 forms a line-shaped semiconductor layer including drain regions 160b and the word line WL is disposed on the first and second semiconductor layer 110,120 to show the structures of the semiconductor layer and the source and drain regions 160a and 160b.

Referring to FIGS. 6 to 8, a semiconductor substrate 100 is connected to a line-shaped semiconductor layer 110 through the source region 160a. The semiconductor layers 110 and 120 at both sides of the source region 160a are surrounded by the word lines WL wherein a channel 110b is formed. The drain regions 160b are formed in the semiconductor layers 110 and 120 at outer sides of the word lines WL to from the source region 160a. The semiconductor layers 110 and 120 in which the channel 110b and the drain region 160b are to be formed is maintained at a floating state. The dummy word line D_WL is disposed between the drain regions 160b and storage layers 185 are formed in spaces between the word lines WL and the dummy word line D_WL to be electrically connected to the drain regions 160b. The storage layer is selectively driven in response to enabling of the word line WL.

The source region 160a and the drain regions 160b are simultaneously formed in the exemplary embodiment. However, in another embodiment, the source region 160a and the drain regions 160b are separately formed.

Figure 9A:
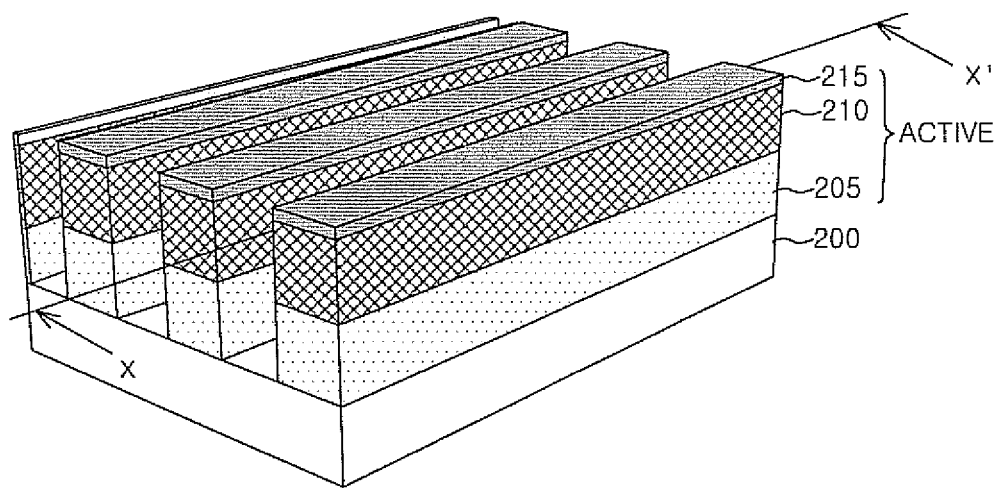
FIGS. 9A to 9E are perspective views illustrating a high-integration semiconductor memory device according to an exemplary embodiment of the present invention.
Figure 10A:
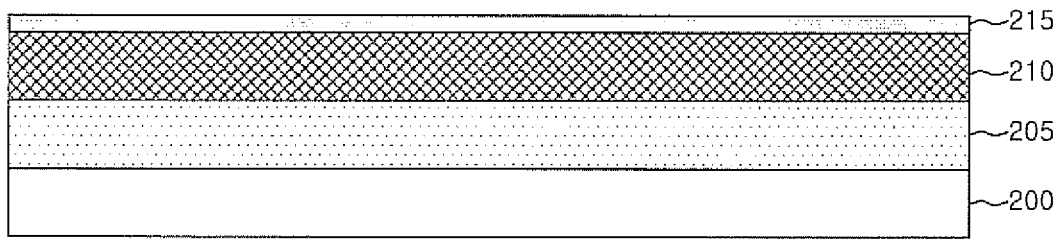
FIGS. 10A to 10E are cross-sectional views of the high-integration semiconductor memory device taken along lines X-X' of FIGS. 9A to 9E, respectively.

That is, referring to FIGS. 9A and 10A, a sacrificial layer 205, a first semiconductor layer 210, and a hard mask layer 215 are sequentially stacked. The sacrificial layer 205 and the first semiconductor layer 210 may be grown through an epitaxy process. The hard mask layer 215, the first semiconductor layer 210, and the sacrificial layer 205 are patterned in a line shape to form an active region ACTIVE.

Figure 9B:
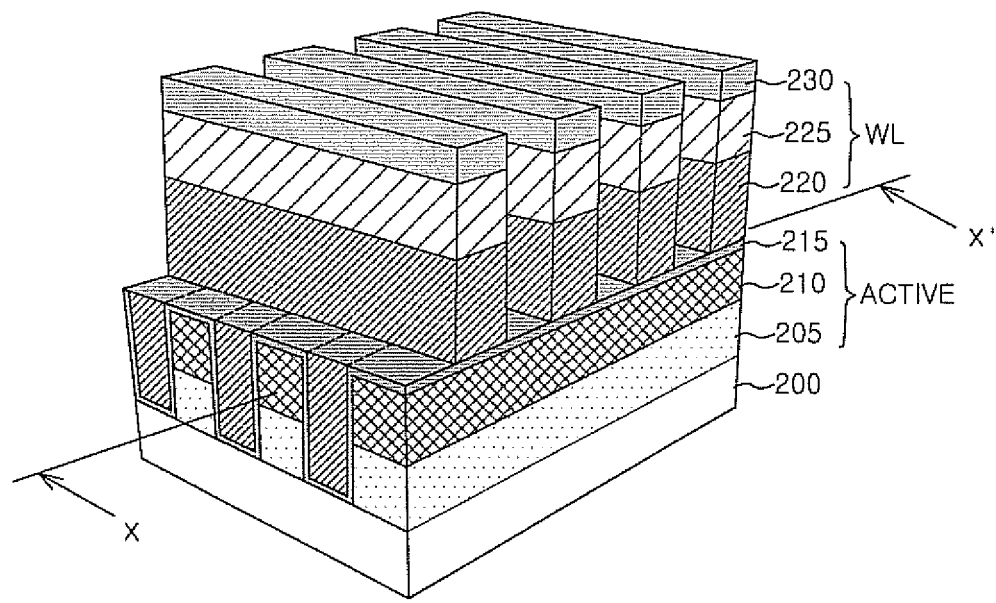
Figure 10B:
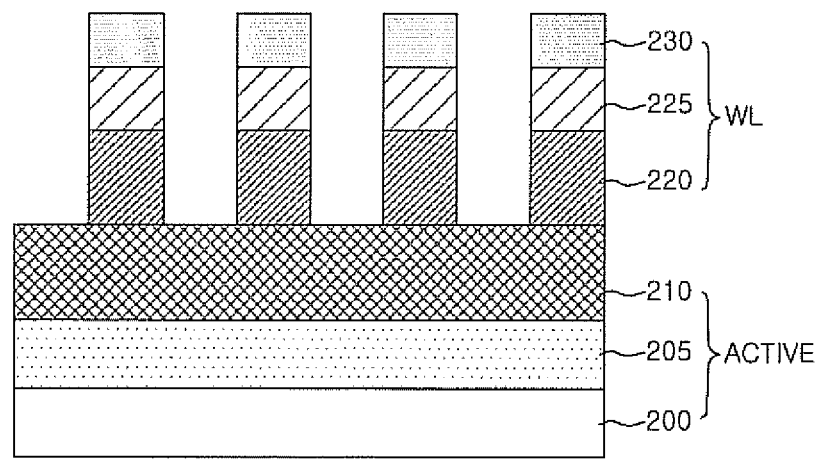

Referring to FIGS. 9B and 10B, a gate insulating layer (not shown) is formed on a surface of the active region ACTIVE and then a word line WL is formed to cross the active region ACTIVE. The word line WL may be configured of a conduction layer 220 for a gate, a gate barrier metal layer 225, and a hard mask layer 230 and formed to surround three sides of the active region ACTIVE.

Figure 9C:
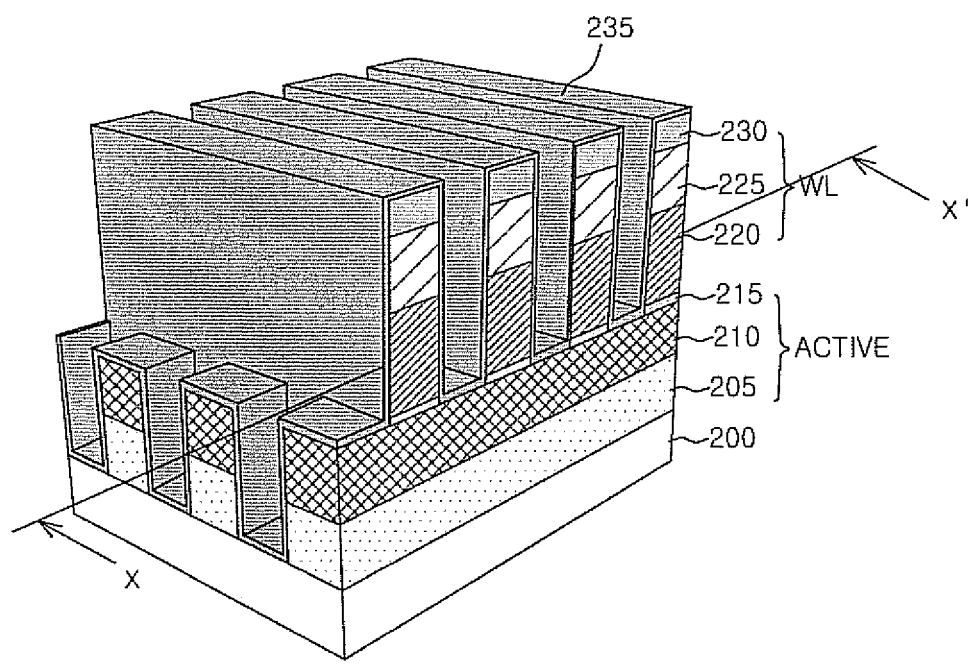
Figure 10C:
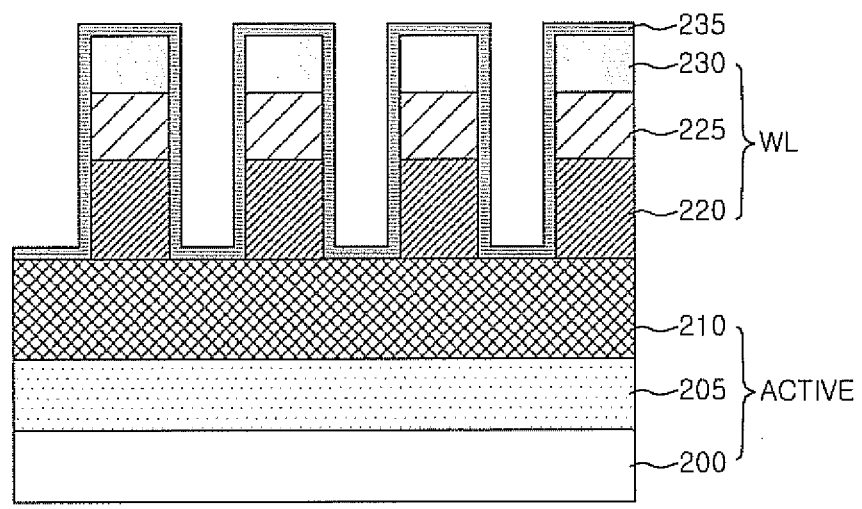

Referring to FIGS. 9C and 10C, a capping layer 235 is formed to surround a resultant surface of the semiconductor substrate 200 in which the word line is formed. A portion of the capping layer 235 may be removed to expose an edge portion of the active region ACTIVE.

Figure 9D:
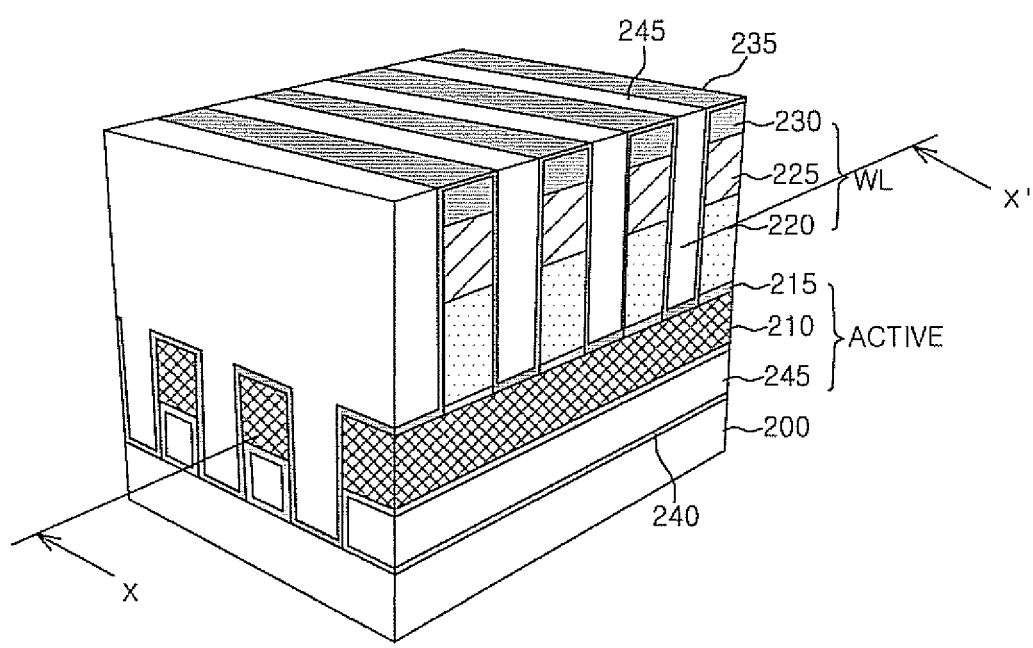
Figure 10D:
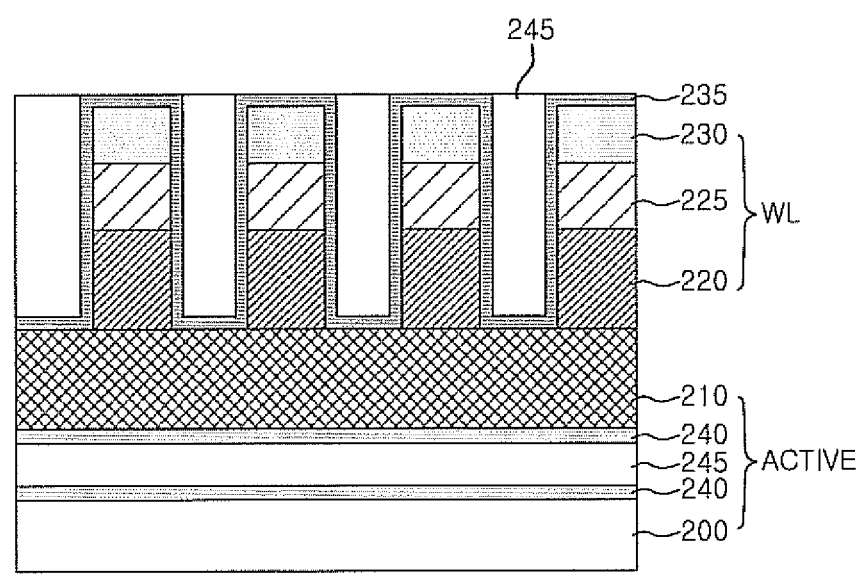

Referring to FIGS. 9D and 10D, a sacrificial layer 205 is removed through the exposed active region ACTIVE and then a gate spacer layer 240 is formed within a space from which the sacrificial layer is removed, that is, surfaces of the semiconductor substrate 200 and the first semiconductor layer 210. The gate spacer layer 240 may include a silicon nitride layer. A first interlayer insulating layer 245 is formed to be buried within the space from which the sacrificial layer 205 is removed and a space between the word lines. The first interlayer insulating layer 245 may include an insulating layer such as spin on dielectric (SOD).

Figure 9E:
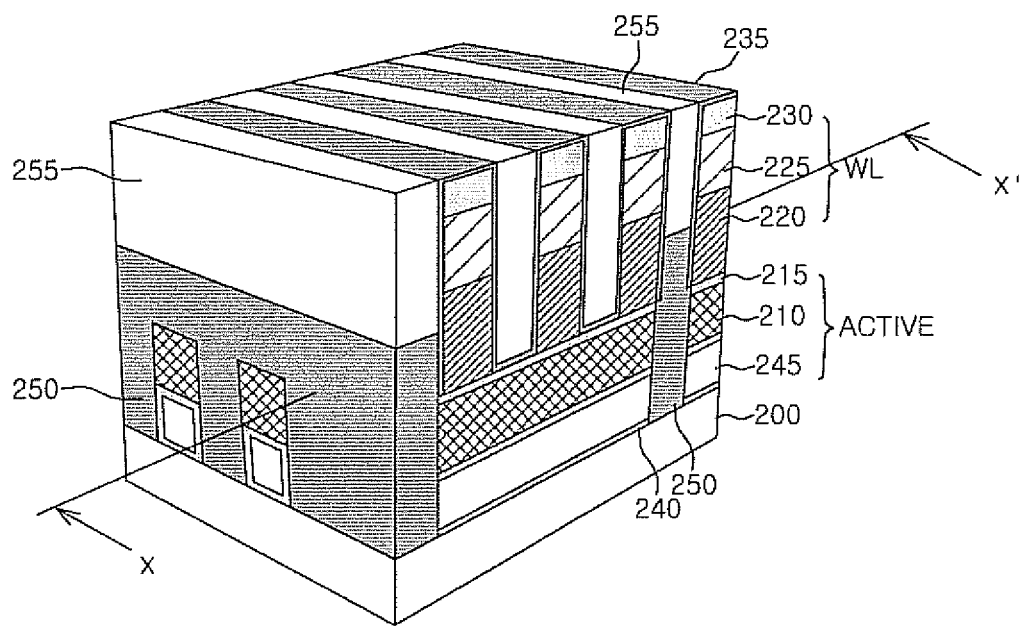
Figure 10E:
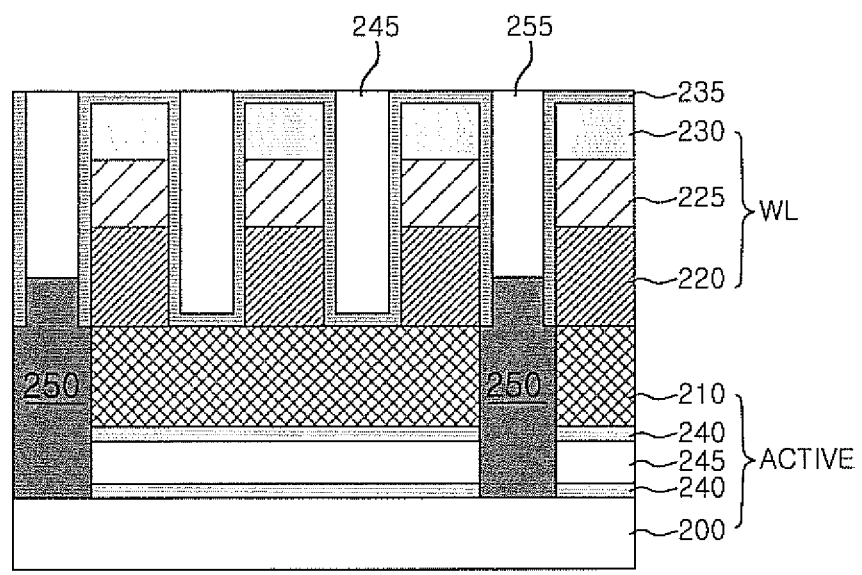

Referring to FIGS. 9E and 10E, a photoresist pattern (not shown) is formed on a resultant structure of the semiconductor substrate to expose a source formation region. At that time, the source formation region can be corresponded to one of spaces between the word lines WL. Further, a width of an area exposed by the photoresist pattern can be larger than that of the source formation region. The first interlayer insulating layer 245 between the word lines WL, the first semiconductor layer 210, and the first interlayer insulating layer 245 below the first semiconductor layer 210 are etched to form a contact hole (not shown) exposing the semiconductor substrate 200 corresponding to the source formation region. A second to semiconductor layer is deposited on a resultant structure of the semiconductor substrate 200 to be filled within the contact hole. The second semiconductor layer is recessed up to a level of the first semiconductor layer 210 to form a source region 250 including the second semiconductor layer. Next, a second interlayer insulating layer 255 is buried within the contact hole on the source region 250. According to, the source region 250 can be formed by a self-align technique.

Subsequently, a process of forming a lower electrode, a process of forming a storage layer, and a process of forming a bit line may be performed the same as the processes performed in the above-described exemplary embodiment.

As described above, according to the exemplary embodiment, a transistor having a horizontal channel structure is used as a switching element so that the semiconductor memory device is manufactured in a stable structure. In addition, two transistors sharing a source region are provided in one unit active region and a phase-change storage cell is provided in each drain so that an area efficiency of the semiconductor memory device having the horizontal channel structure is improved.

The above-described exemplary embodiments are exemplary only, the present invention should include all embodiments consistent with the exemplary features as described above and in the accompanying drawings and claims.

What is claimed is:

1. A method of manufacturing a semiconductor memory device, comprising:
    forming a line pattern-shaped active region including posts at a first constant interval on a semiconductor substrate;
    forming a plurality of word lines at a second constant interval to cross the active region;
    performing ion implantation of impurities on the active region at both sides of each of the word lines to form source regions in the implanted active region corresponding to the posts and drain regions in remaining implanted active region;
    forming lower electrodes on the source and drain regions exposed between the word lines;
    forming a spacer insulating layer on the lower electrodes and sidewalls of the word lines;
    etching the spacer insulating layer to selectively expose the lower electrodes on the drain regions; and
    forming storage layers on the exposed lower electrodes and the spacer insulating layer.

2. The method of claim 1, wherein the forming of the active region includes:
    forming a sacrificial layer on the semiconductor substrate;
    forming a first semiconductor layer having a different etch selectivity from the sacrificial layer on the sacrificial layer;
    etching the first semiconductor layer and the sacrificial layer to expose the semiconductor substrate corresponding to the source regions;
    forming a second semiconductor layer having a different etch selectivity from the sacrificial layer on the first semiconductor layer and the semiconductor substrate; and
    removing the sacrificial layer.

3. The method of claim 2, further comprising:
    filling an insulating material in a space from which the sacrificial layer is removed.

4. A method of manufacturing a semiconductor memory device, comprising:
    forming a sacrificial layer and a line pattern-shaped active region on a semiconductor substrate;
    forming a plurality of word lines at a constant interval to cross the active region;

selectively removing the sacrificial layer;
forming an insulating layer in a space between the word lines and a space from which the sacrificial layer is removed;
selectively etching the insulating layer on the active region between the word lines to expose the active region;
etching the exposed active region and the insulating layer below the exposed active region to form a source contact hole exposing the semiconductor substrate;
forming a source post in the source contact hole to be connected to the active region;
ion-implanting impurities in the source post and the active region at both sides of each of the word lines to form a source region in the source post and drain regions in the active region;
forming lower electrodes on the source and drain regions;
forming a spacer insulating layer on the lower electrodes;
etching the spacer insulating layer to selectively expose the lower electrodes on the drain regions; and
forming storage layers on the spacer insulating layer and the exposed lower electrodes.

\* \* \* \* \*